(12) United States Patent
Ighani et al.

(10) Patent No.: US 6,351,146 B1
(45) Date of Patent: Feb. 26, 2002

(54) MULTILEVEL CIRCUIT IMPLEMENTATION FOR A TRISTATE BUS

(75) Inventors: Ramin Ighani, Santa Clara; Anup Nayak, Fremont, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/541,320

(22) Filed: Apr. 1, 2000

(51) Int. Cl.[7] .............................................. H03K 19/00
(52) U.S. Cl. ............................... 326/56; 326/57; 326/83
(58) Field of Search .............................. 326/56, 82, 86, 326/57, 58, 83

(56) References Cited

U.S. PATENT DOCUMENTS

| | | | | |
|---|---|---|---|---|
| 5,331,220 A | * | 7/1994 | Pierce et al. | 307/475 |
| 5,489,859 A | * | 2/1996 | Kawaguchi et al. | 326/57 |
| 5,739,701 A | * | 4/1998 | Oshima | 326/82 |
| 5,973,506 A | * | 10/1999 | Trimberger | 326/39 |

* cited by examiner

*Primary Examiner*—Michael Tokar
*Assistant Examiner*—Anh Q. Tran
(74) *Attorney, Agent, or Firm*—Christopher P. Maiorana, P.C.; Robert M. Miller

(57) ABSTRACT

An apparatus comprising a first circuit and a second circuit. The first circuit may be configured to drive a first bus in response to a first control signal. The second circuit may be configured to control a voltage of the first bus in response to the first control signal.

20 Claims, 6 Drawing Sheets

US 6,351,146 B1

MULTILEVEL CIRCUIT IMPLEMENTATION FOR A TRISTATE BUS

FIELD OF THE INVENTION

The present invention relates to a method and/or architecture for tristate busses generally and, more particularly, to a method and/or architecture for a multilevel circuit implementation for a tristate bus.

BACKGROUND OF THE INVENTION

In the construction of electronic circuits, many designers use programmable logic devices such as field programmable gate arrays (FPGAs) and complex programmable logic devices (CPLDs) to implement digital circuit designs. Using a programmable logic device can reduce the amount of time between the conception of a circuit design and the production of a working circuit prototype, as well as facilitating later design changes. However, the utility of a programmable logic device for implementing large and/or complex logic functions may be limited by a lack of appropriate logic circuitry. Specifically, the number of drivers that may be supported on a single line or bus in some programmable logic devices is typically limited by a fixed number of tristate buffers in the device architecture.

Some programmable logic devices have multiple lines. However, the number of tristate buffers associated with any one line is fixed, placing a maximum on the number of drivers that can drive each line. The utility of the device in applications having a large number of drivers driving a common line or bus is diminished once the number of drivers becomes very large or the tristate bus runs over a large physical area. However, by splitting a large tristate bus into a number of lines to form a multilevel tristate bus, an apparent increase in the tristate buffer limit may be achieved. Examples of combining lines to form wide busses may be found in U.S. Pat. No. 5,973,506.

Referring to FIG. 1, a circuit diagram illustrating a multilevel tristate bus 10 is shown. The tristate bus 10 has two lines 12 and 14. Each of the lines 12 and 14 has three tristate buffers 16a–16c and 16d–16f, respectively. The line 12 is connected to a first input of an AND gate 18. The line 14 is connected to a second input of the AND gate 18. The lines 12 and 14 are resistively coupled to a supply voltage VCC via pull-up resistors 20 and 22, respectively.

Due to the effects of pull-up resistor 20 and 22, lines 12 and 14 default to a HIGH logic value in the absence of a low impedance path to ground from any one of the tristate buffers 16a–16f. Because the tristate buffers 16a–16f present a high impedance if any one of the tristate buffer control inputs is LOW, the logic value of the lines 12 and 14 is HIGH if logic inputs to the tristate buffers 16a–16f are HIGH or if the control input of the tristate buffers 16a–16f are pulled LOW. The wired function provided by the connection of the tristate buffers 16a–16c and 16d–16f is therefore equal to an AND function. By connecting the lines 12 and 14 with the AND gate 18, the multilevel implementation acts like a single line with twice the number of tristate buffers. When one of the tristate buffers 16a–16f is enabled, a corresponding input signal (e.g., IN0–IN6) is communicated to an output 24 of the AND gate 18. To avoid contentions, only one of the tristate buffers 16a–16f is enabled at a given time.

Each tri-state driver is connected to a signal source. Only one driver drives at a time, and the rest are disabled. For a large number of sources, each buffer has to drive a large load. Driving a large load makes the signal conduction very slow.

The lines 12 and 14 are coupled to VCC via the pull-up resistors 20 and 22. The pull-up resistors 20 and 22 may, for example, be implemented with a NMOS transistor having a gate tied to VCC or with a PMOS transistor having a gate tied to ground. The current sourcing ability of the pull-up resistors 20 and 22 are designed to be weak relative to the current sinking ability of any single tristate buffer 16a–16f coupled to the lines 12 and 14. The weak current sourcing ability of the resistors 20 and 22 permits the tristate buffers to pull the lines 12 and 14 to a LOW logic value more quickly. When a buffer on line 12 is disabled and a buffer on line 14 is enabled, the weak pull-up of the resistor 20 can be very slow pulling the line 12 HIGH.

SUMMARY OF THE INVENTION

The present invention concerns an apparatus comprising a first circuit and a second circuit. The first circuit may be configured to drive a first bus in response to a first control signal. The second circuit may be configured to control a voltage level of the first bus in response to the first control signal.

The objects, features and advantages of the present invention include providing a method and/or architecture for a multilevel circuit implementation for a tristate bus that may (i) decrease a load on drivers connected to a bus, (ii) speed up the critical path, (iii) allow new data from another net to be placed more quickly on a bus and/or (iv) increase speed with little additional cost in area or power.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
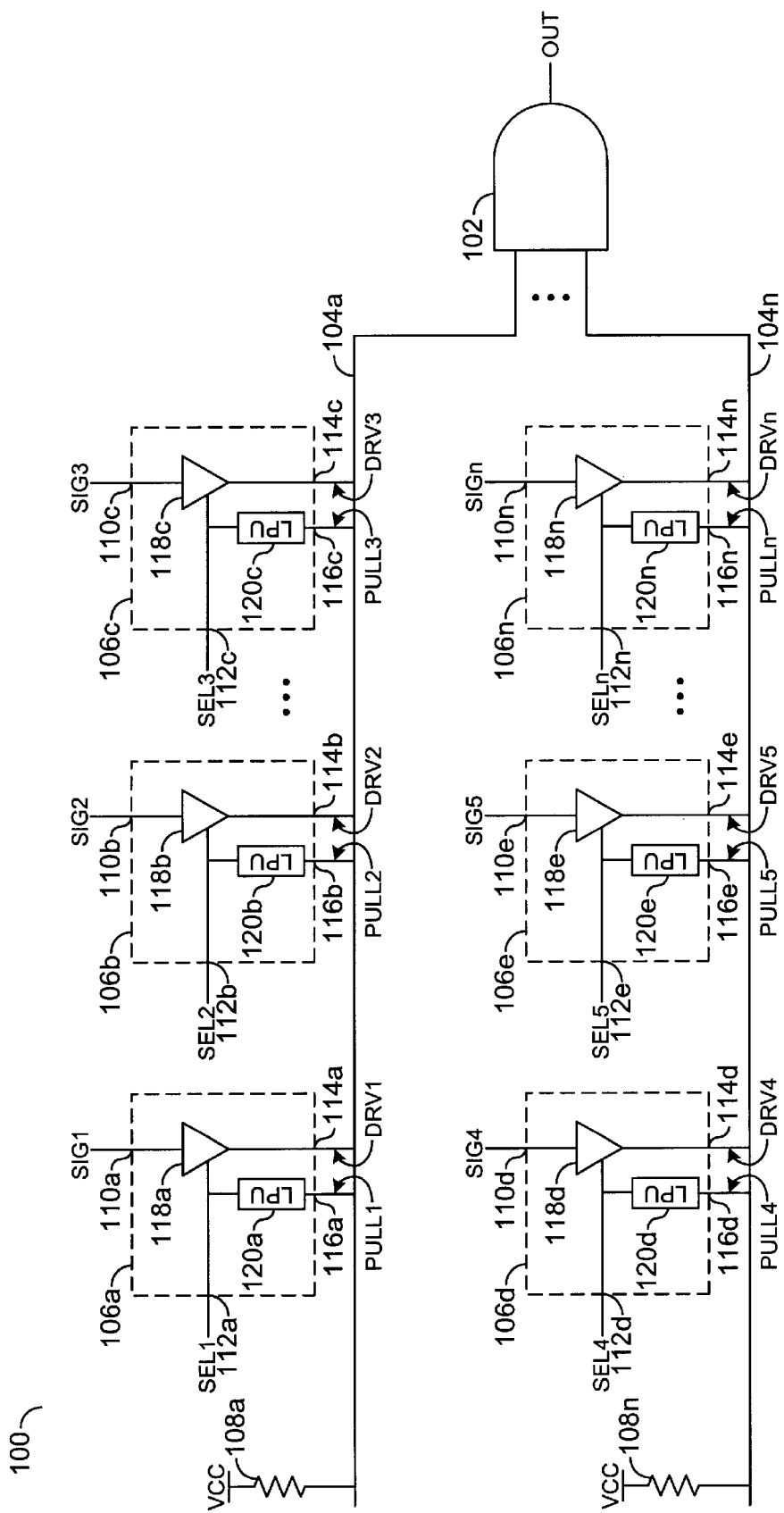
FIG. 2 is a block diagram of a preferred embodiment of the present invention.

Referring to FIG. 2, a block diagram of a circuit 100 illustrating a preferred embodiment of the present invention is shown. The circuit 100 may be implemented as a multilevel tri-state bus that is driven by a number of data sources located around a chip. The circuit 100 may comprise, in one example, a gate 102, a number of lines 104a–104n, and a number of bus drivers 106a–106n. The gate 102 may be implemented as an AND gate. However, other types gates may be implemented accordingly to meet the design criteria of a particular application. Each of the lines 104a–104n may be connected to an input of the gate 102.

The lines 104a–104n may be coupled to a supply voltage (e.g., VCC) via a number of pull-up resistors 108a–108n. The pull-up resistors 108a–108n may, in one example, be implemented with an NMOS transistor having a gate tied to VCC or with a PMOS transistor having a gate tied to ground.

Each of the bus drivers 106a–106n may have an input 110a–110n that may receive a signal (e.g., SIG1–SIGn), an input 112a–112n that may receive a control signal (e.g., SEL1–SELn), an output 114a–114n that may present a signal (e.g., DRV1-DRVn) to one of the lines 104a–104n, and an output 116a–116n that may present a signal (e.g., PULL1–PULLn) to one of the lines 104a–104n. When a bus driver 106a–106n is deselected (e.g., the corresponding disable it signal SEL1–SELn switches to a logic LOW), the corresponding signal PULL1–PULLn may be generated as a HIGH pulse quickly pulling the associated line 104a–104n HIGH. The quick pull up pulse may enable a next driver selected on the tristate bus to gain control of the bus more quickly than if only the device 108a was to pull up the bus.

The bus drivers 106a–106n may comprise a tristate buffer 118a–118n and a local pull-up circuit 120a–120n. The tristate buffers 118a–118n may be configured to generate the signals DRV1–DRVn in response to the signals SIG1–SIGN and SEL1–SELn. The local pull-up circuits 120a–120n may be configured to generate the signals PULL1–PULLn in response to the signals SEL1–SELn.

Only one bus driver circuit 106a–106n is generally enabled at a given time. In general, each of the bus drivers 106a–106n, a tristate buffer 118a–118n and a local pull up circuit 120a–120n. The tristate buffers 118a–118n may be scattered around a chip. Routing to connect more than one buffer to a local pull up circuit may be too difficult. However, if a number of the tristate buffers 118a–118n are close enough together, a single local pull up circuit (e.g., 120j) may be used for more than one tristate buffer (see description in connection with FIG. 6 below).

Figure 1:
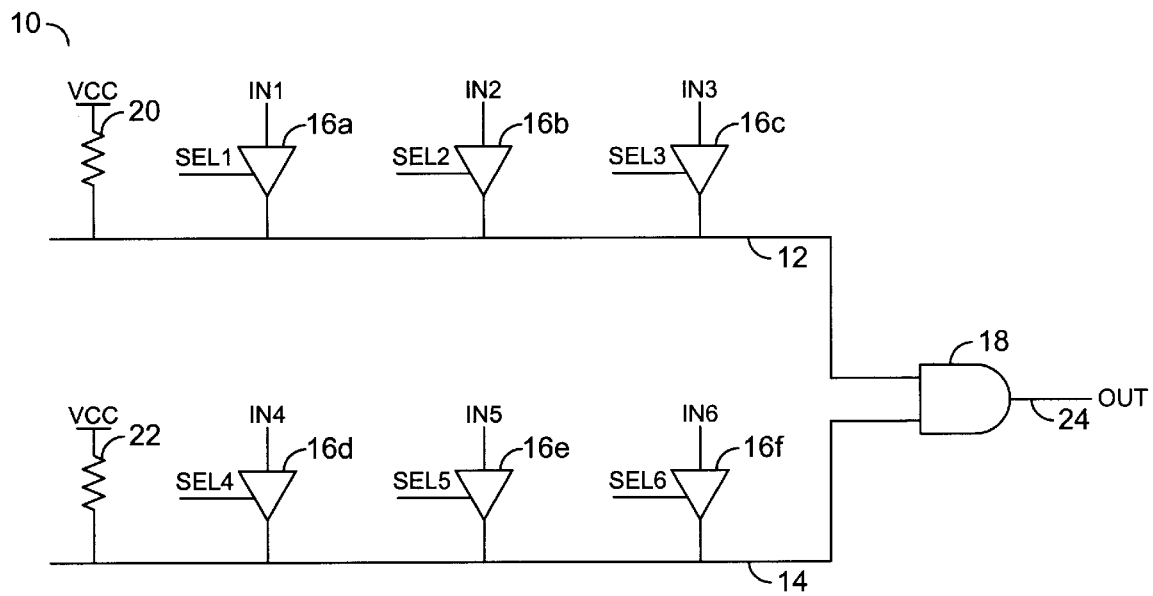
FIG. 1 is a block diagram illustrating a conventional implementation for a tristate bus.
Figure 3:
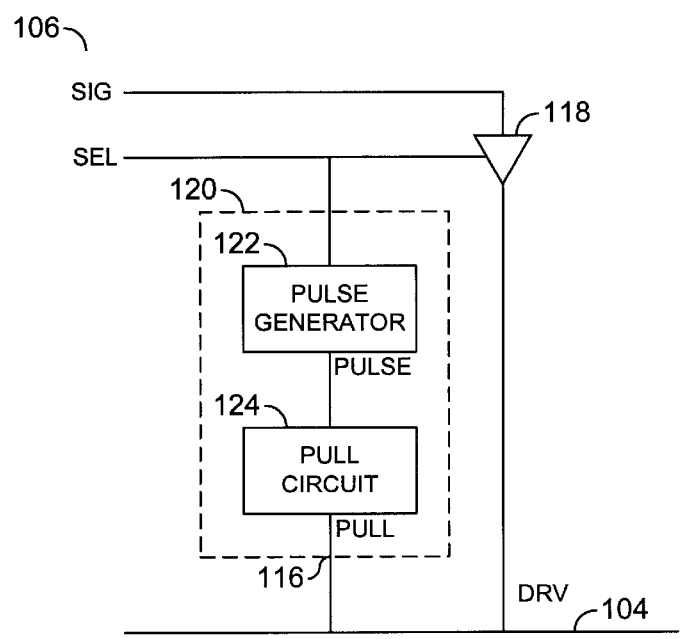
FIG. 3 is a detailed block diagram of a local pull up circuit of FIG. 2.

Referring to FIG. 3, a block diagram illustrating an implementation of a circuit 106 of FIG. 2 in accordance with the present invention is shown. The circuit 120 may comprise a pulse generator circuit 122 and a pull circuit 124. The pulse generator circuit 122 may have an input that may receive the signal SEL and an output that may present a signal (e.g., PULSE) to an input of the pull circuit 124. The signal PULSE may be generated in response to the signal SEL. The signal PULSE may comprise a single pulse having a predetermined pulse width. The pulse width of the signal PULSE may be predetermined to control a voltage level of the bus 104 in a predetermined amount of time. In one example, the pulse generator circuit 122 may be implemented as a one-shot circuit. The pull circuit 124 may be configured to generate the signal PULL in response to the signal PULSE.

Figure 4:
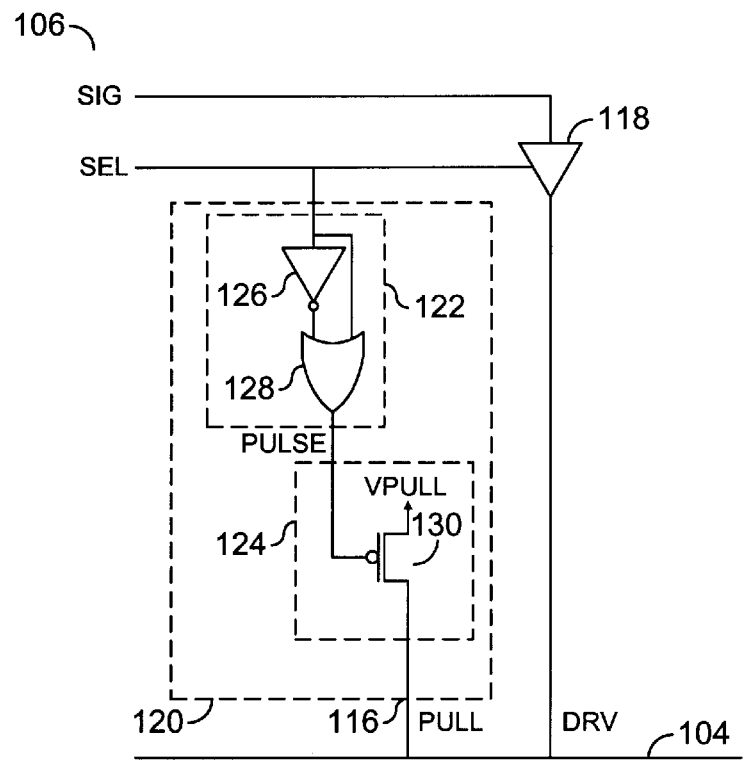
FIG. 4 is a more detailed block diagram illustrating an implementation of the circuit of FIG. 3.

Referring to FIG. 4, a more detailed block diagram illustrating a preferred embodiment of the circuit 106 is shown. The pulse generator circuit 122 may comprise, in one example, a delay circuit 126 and a gate 128. The delay circuit may be implemented, in one example, as an inverter. The gate may be implemented, in one example, as an OR gate. However, other types of delay circuits and gates may be implemented to meet the design criteria of a particular application. The signal SEL may be presented to an input of the inverter 126 and a first input of the gate 128. An output of the inverter 126 may be connected to a second input of the gate 128. The signal PULSE may be presented at an output of the gate 128.

The pull circuit 124 may comprise, in one example, a transistor 130. The transistor 130 may be implemented, in one example, as one or more PMOS transistors. However, other types and/or polarities of transistors may be implemented to meet the design criteria of a particular application. The signal PULSE may be presented to a gate of the transistor 130. A source of the transistor 130 may be connected to a voltage supply (e.g., VPULL). In an application where the bus 104 is generally maintained at a supply voltage (e.g., VCC), the supply voltage VPULL may be the supply voltage VCC. In an application where the bus 104 is generally maintained at a ground voltage (e.g., GND), the supply voltage VPULL may be the ground voltage GND. A drain of the transistor 130 may be connected to the bus 104. The signal PULL may be presented at the drain of the transistor 130.

Figure 5:
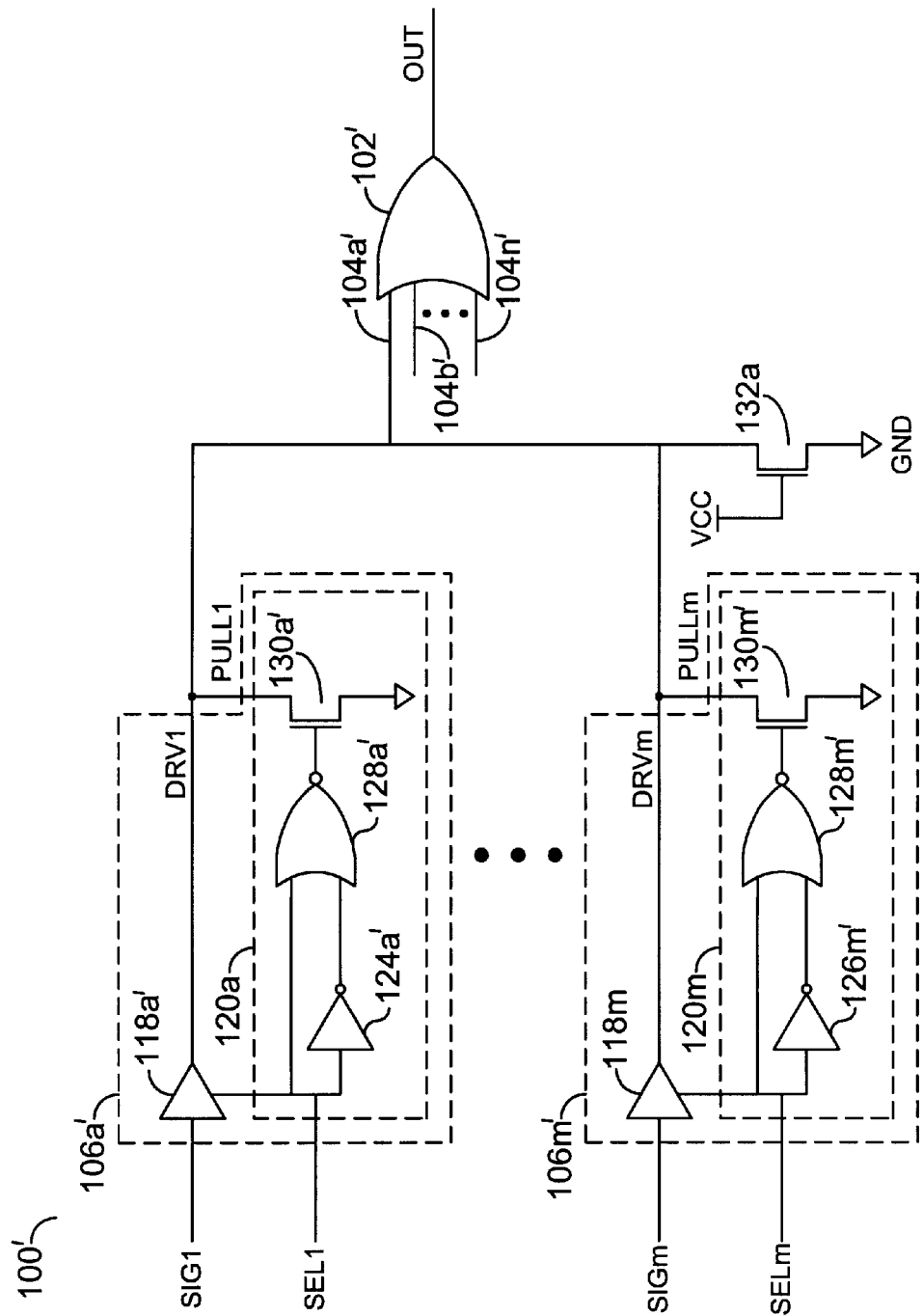
FIG. 5 is a detailed block diagram of an alternate embodiment of the present invention.

Referring to FIG. 5, a block diagram of a circuit 100' illustrating an alternative embodiment of a multilevel tristate bus in accordance with the present invention is shown. The circuit 100' may comprise a gate 102', a number of lines 104a'–104n' and a number of bus drivers 106a'–106n'. The number of bus drivers 106a'–106n' may be divided into groups of M where M is an integer. Each of the groups of bus drivers may be connected to one of the lines 104a'–104n'. The circuit 100' may be implemented similarly to the circuit 100. However, the gate 102' may be implemented, in one example, as an N-input OR gate and the bus drivers 106a'–106n' may comprise a NOR gate 128a'–128n' and a NMOS transistor 130a'–130n' (a group of M drivers is illustrated). A source of the transistors 130a'–130n' may be connected to the ground voltage GND. Each of the lines 104a'–104n' may be coupled to the ground voltage GND by a transistor 132a–132n. A gate of the transistors 132a–132n may be connected to the supply voltage VCC.

The lines 104a'–104n' may be driven LOW by the transistors 132a–132n. Another way of disabling the lines 104a'–104n' may be to control the gate of the transistors 132a–132n with a logic circuit. Controlling the transistors 132a–132n may save leakage current. However, extra routing in the layout may be needed.

Figure 6:
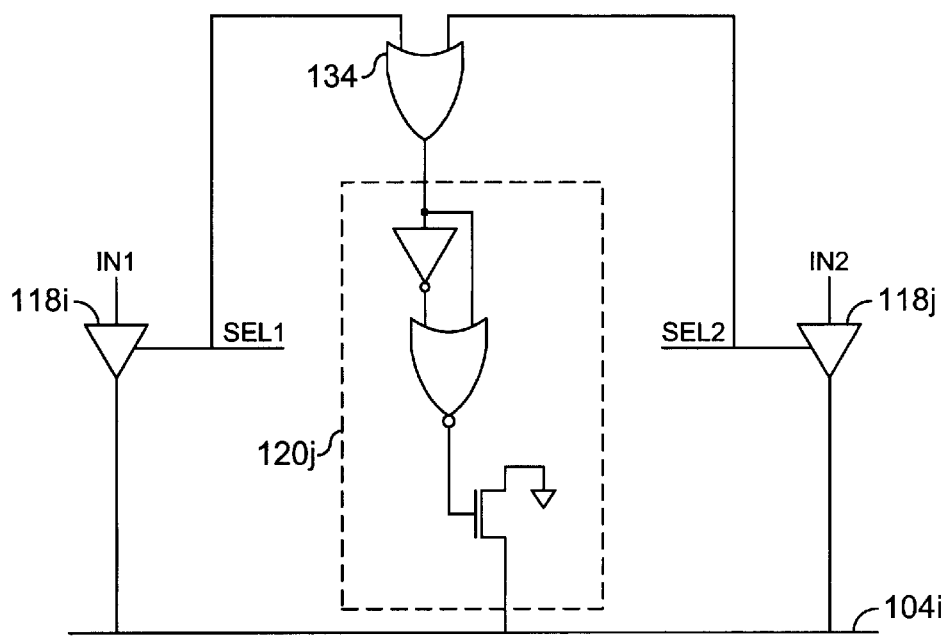
FIG. 6 is a detailed block diagram of another alternative embodiment of the present invention.

Referring to FIG. 6, a detailed block diagram of an alternative embodiment of the present invention is shown. When a number of the tristate buffers 118a–118n are adjacent (e.g., 118i and 118j), a single local pull down (or pull up) circuit (e.g., 120j) may be used for more than one tristate buffer. A tristate control signal (e.g., SELL) of the driver 118i may be presented to a first input of a gate 134. A tristate control signal (e.g., SEL2) of the driver 118j may be presented to a second input of the gate 134. The gate 134 may have an output that may present a combined tristate control signal to an input of the local pull down circuit 120j. When either of the drivers 118i or 118j is deselected, the pull down circuit 120j will generally present a LOW pulse to the bus 104i. When the bus 104i has a default logic level that is HIGH, the circuit 120j may be implemented with an OR gate and a PMOS transistor having a source connected to the supply voltage VCC.

Figure 7:
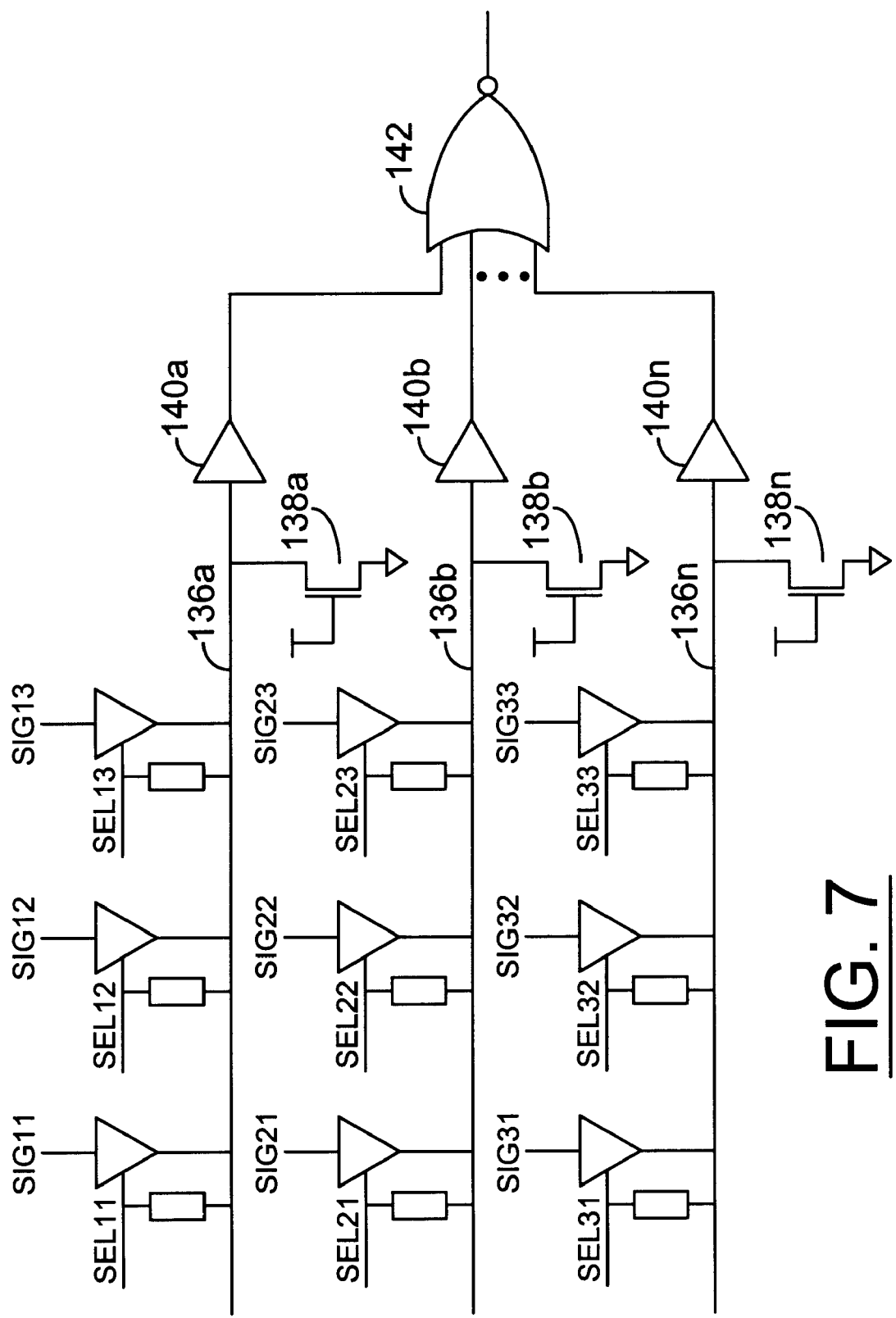
FIG. 7 is a block diagram of another alternative embodiment of the present invention.

Referring to FIG. 7, a block diagram illustrating another alternative embodiment is shown. A large tristate bus may be sub-divided into a number of smaller tristate buses 136a–136n. The smaller tristate buses 136a–136n may be arranged hierarchically. The small busses 136a–136n may provide quicker overall response times.

The small busses 136a–136n may comprise a semiglobal pull down (or pull up) 138a–138n and a local buffer 140a–140n. The local buffers 140a–140n may be implemented, in one example, as full rail logic restoration gates. The buffers 140a–140n may be configured to quickly respond to selection and de-selection of drivers connected to the small busses 136a–136n.

An input of the buffers 140a–140n may be connected to the small busses 136a–136n. An output of the buffers 140a–140n may be connected to an input of a gate 142. The gate 142 may be implemented, in one example, as an N-input NOR gate. However, other types of gates may be implemented to meet the design criteria of a particular application. An output of the gate 142 may be connected to a next hierarchy of small busses or a large tristate bus.

Figure 8:
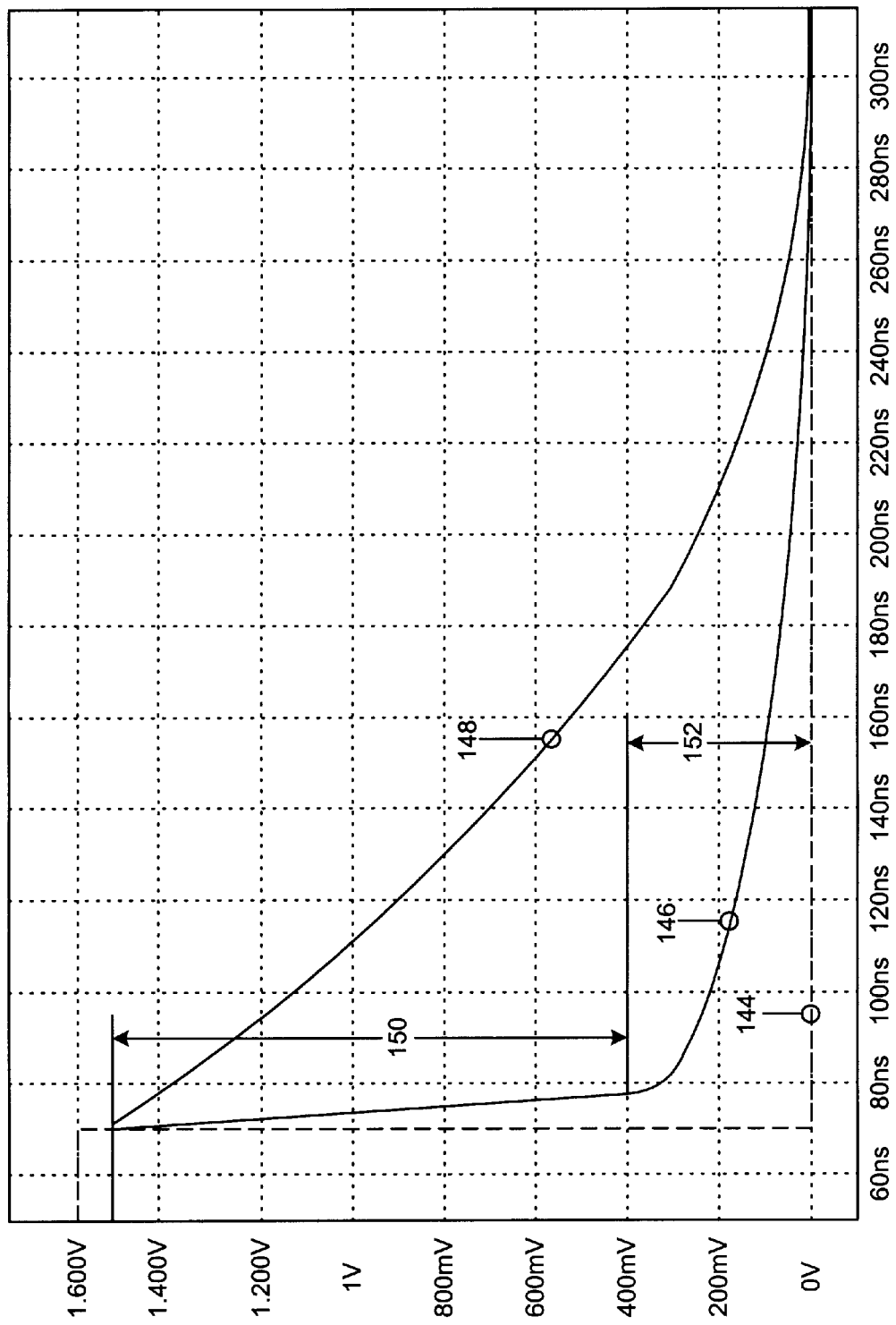
FIG. 8 is a timing diagram illustrating an example operation of the present invention.

Referring to FIG. 8, a timing diagram illustrating an example operation of the circuit 100 is shown. When a driver 106 is deselected, a tristate control signal is generally switched to a logic LOW state (e.g., trace 144). The driver 106 may provide a faster pull down (e.g., trace 146) than the device 108 may achieve (e.g., trace 148). The pulse of the circuit 120 may provide a rapid drop in the voltage level of the bus 104 (e.g., portion 150). When the pulse provided by the circuit 120 is finished, the voltage level of the bus 104 is generally controlled by the device 108 (e.g., portion 152).

The various signals are generally "on" (e.g., a digital HIGH, or 1) or "off" (e.g., a digital LOW, or 0). However, the particular polarities of the on (e.g., asserted) and off (e.g., deasserted) states of the signals may be adjusted (e.g., reversed) accordingly to meet the design criteria of a particular implementation.

When a bus driver is deselected, the present invention may provide for quickly deselecting the corresponding line, allowing new data from another line to be placed on the bus.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to drive a first bus in response to an input signal and a first state of a control signal and present a high impedance to said first bus in response to a second state of said control signal; and
   a second circuit configured to (i) start pulling a voltage of said first bus toward a supply level in response to said second state of said control signal and (ii) stop pulling after a predetermined period of time.

2. The apparatus according to claim 1, wherein said first circuit comprises a tristate buffer.

3. The apparatus according to claim 1, wherein said second circuit comprises a pulse generator circuit.

4. The apparatus according to claim 3, wherein said pulse generator circuit comprises a delay circuit and a logic gate.

5. The apparatus according to claim 4, wherein said delay circuit comprises an inverter circuit.

6. The apparatus according to claim 4, wherein said logic gate comprises an OR gate or a NOR gate.

7. The apparatus according to claim 3, wherein said second circuit further comprises a pull circuit.

8. The apparatus according to claim 7, wherein said pull circuit is connected between a voltage supply and said first bus.

9. The apparatus according to claim 8, wherein said voltage supply comprises a positive voltage supply or a ground supply.

10. The apparatus according to claim 7, wherein said pull circuit comprises a transistor.

11. The apparatus according to claim 10 wherein said transistor comprises a PMOS transistor or a NMOS transistor.

12. A programmable logic device comprising one or more of the apparatus according to claim 1.

13. The apparatus according to claim 1, further comprising:
    a third circuit configured to drive a second bus in response to a second input signal and a first state of a second control signal and present a high impedance to said second bus in response to a second state of said second control signal; and
    a fourth circuit configured to (i) start pulling a voltage level of said second bus toward a supply level in response to said second state of said second control signal and (ii) stop pulling after said predetermined period of time.

14. The apparatus according to claim 13, wherein said first bus and said second bus are connected to inputs of a logic gate.

15. The apparatus according to claim 14, wherein said logic gate comprises an AND gate or an OR gate.

16. The apparatus according to claim 1, wherein said first bus is connected to a plurality of said apparatuses.

17. The apparatus according to claim 16, wherein said bus is one of a plurality of similar busses.

18. The apparatus according to claim 17 wherein each of said plurality of busses is connected to an input of a logic gate.

19. An apparatus comprising:
    means for driving a bus in response to an input signal and a first state of a control signal and presenting a high impedance to said bus in response to a second state of said control signal; and
    means for pulling a voltage of said bus toward a supply level for a predetermined period of time in response to said second state of said control signal.

20. A method for providing a multilevel circuit implementation for a tristate bus comprising the steps of:
    (A) driving a bus in response to an input signal and a first state of a control signal and presenting a high impedance to said bus in response to a second state of said control signal; and
    (B) pulling a voltage of said bus toward a supply level for a predetermined period of time in response to said second state of said control signal.

* * * * *